United States Patent
Cheng

(10) Patent No.: US 7,371,089 B2
(45) Date of Patent: May 13, 2008

(54) MEMORY CARD CONNECTOR WITH IMPROVED FOLDABLE BAFFLER

(75) Inventor: Yung-Chang Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/805,130

(22) Filed: May 22, 2007

(65) Prior Publication Data

US 2007/0270000 A1    Nov. 22, 2007

(30) Foreign Application Priority Data

May 22, 2006    (TW)    ............................... 95208802 U

(51) Int. Cl.
*H01R 13/62*    (2006.01)
(52) U.S. Cl. .................................................... 439/159
(58) Field of Classification Search ............... 439/76.1, 439/159, 607, 892, 64, 377, 630, 357; 361/737
See application file for complete search history.

(56) References Cited

U.S. PATENT DOCUMENTS

| 6,120,322 | A | 9/2000 | Ho et al. |
| 6,269,005 | B1 | 7/2001 | Tung et al. |
| 6,692,277 | B2* | 2/2004 | Hu et al. ..................... 439/188 |
| 6,887,087 | B2 | 5/2005 | Lai et al. |
| 7,097,475 | B2 | 8/2006 | Cheng |
| 7,150,650 | B2* | 12/2006 | Kuo ........................... 439/607 |
| 7,232,320 | B2* | 6/2007 | Kuo ........................... 439/159 |
| 2001/0049214 | A1 | 12/2001 | Billman |

FOREIGN PATENT DOCUMENTS

| CN | 2809952 Y | 8/2006 |
| CN | 2857254 Y | 1/2007 |
| TW | 293561 | 7/2006 |
| TW | 296504 | 8/2006 |

* cited by examiner

*Primary Examiner*—J. F. Duverne
(74) *Attorney, Agent, or Firm*—Wei Te Chung

(57) ABSTRACT

A memory card connector includes a metal cover defining a receiving space in which two different types of memory cards are insertable in an insertion direction through an insert opening generally at a rear end of the metal cover to respectively correspondingly connect with contacts mounted in a connector housing at a front end of metal cover. The metal cover further includes a pair of lateral walls spaced from each other in a direction transversely of the insertion direction, and a foldable baffler is mounted to the lateral walls at the insert opening and includes an opening opposite to the connector housing in the insertion direction.

17 Claims, 6 Drawing Sheets

MEMORY CARD CONNECTOR WITH IMPROVED FOLDABLE BAFFLER

BACKGROUND OF THE INVENTION

1. Field of the Invention

The present invention is directed to a memory card connector, and more specifically, to a memory card connector with improved foldable baffler.

2. Description of Related Arts

Memory cards are known in the art and contain intelligence in the form of a memory circuit or other electronic program. Some form of card reader reads the information or memory stored on the card. Such cards are used in many applications in today's electronic society, including video cameras, digital still cameras, smart phones, PDA's, music players, ATMs, cable television decoders, toys, games, PC adapters, multi-media cards and other electronic applications. Typically, a memory card includes a contact or terminal array for connection through a card connector to a card reader system and then to external equipment. The connector readily accommodates insertion and removal of the card to provide quick access to the information and program on the card. The card connector includes terminals for yieldingly engaging the contact array of the memory card.

In order to facilitate widespread use of memory cards, certain standards have been developed, for example the PCMCIA (Personal Computer Memory Card International Association) standard that defines, inter alia, the connection interface and external dimensions of the cards. To this date, there are three standard PCMCIA cards, type 1, type 2 and type 3. The type 3 relates to an Express Card, which is consisted of two-shape memory cards, a rectangular card, and a L-shape card. Accordingly, there are two shapes Express Card connectors to accommodate said two shape memory cards, wherein a L-shape connector can receive either said L-shape card or rectangular card, a rectangular connector only can receive a rectangular card.

A conventional L-shape express card connector, shown in TW Pat. No. 293561, which is published in Jul. 1, 2006 and assigned to Molex, includes a foldable baffler 51 installed at one lateral side of an insertion opening thereof. When a rectangular memory card is inserted into or pulled out from insertion opening, said foldable baffler cannot pivot inwardly along a traverse axis thereof, with a lateral side thereof being abutting against said rectangular memory card, for avoiding a deflection of card. When a L-shape memory card is inserted into said insertion opening, the foldable baffler can be pushed and pivoted inwardly along said axis for allowing the L-shape memory card to extend through. In this prior reference, for preventing the baffler from pivoting along said axis excessively, top and front plates 250, 251 are formed by a serial of complex processes. These spring plates are easy to distort and make an insertion of memory card inconveniently. And, setting two lateral plates 220 by stamping process make whole memory card connector complex and difficult to assembly. Similar structures are described in prior references, such as U.S. Pat. Nos. 6,887,087B2, 7,097,475B2, 6,120,322, and Chinese Pat. Pub. No. 2809952Y.

Hence, a memory card connector having improved foldable baffler is desired.

SUMMARY OF THE INVENTION

Accordingly, the object of the present invention is to provide a memory card connector with improved foldable baffler for preventing a memory card from deflection.

Another object of the present invention is to provide a memory card connector with improved foldable baffler, which is simple in structure and easy to assemble with a shell.

A third object of the present invention is to provide a memory card connector, which can prevent a foldable baffler from pivoting excessively.

To achieve the above objects, a memory card connector includes a metal cover defining a receiving space in which two different types of memory cards are insertable in an insertion direction through an insert opening generally at a rear end of the metal cover to respectively correspondingly connect with contacts mounted in a connector housing at a front end of metal cover. The metal cover further includes a pair of lateral walls spaced from each other in a direction transversely of the insertion direction, and a foldable baffler is mounted to the lateral walls at the insert opening and includes an opening opposite to the connector housing in the insertion direction.

Other objects, advantages and novel features of the invention will become more apparent from the following detailed description of the present embodiment when taken in conjunction with the accompanying drawings.

BRIEF DESCRIPTION OF THE DRAWING

FIG. 5 is a perspective, assembled view of the memory card connector, with a rectangular memory card being inserted in; and FIG. 6 is a perspective, assembled view of the memory card connector, with a L-shape memory card connector being inserted in.

DETAILED DESCRIPTION OF THE PREFERRED EMBODIMENT

Figure 1:
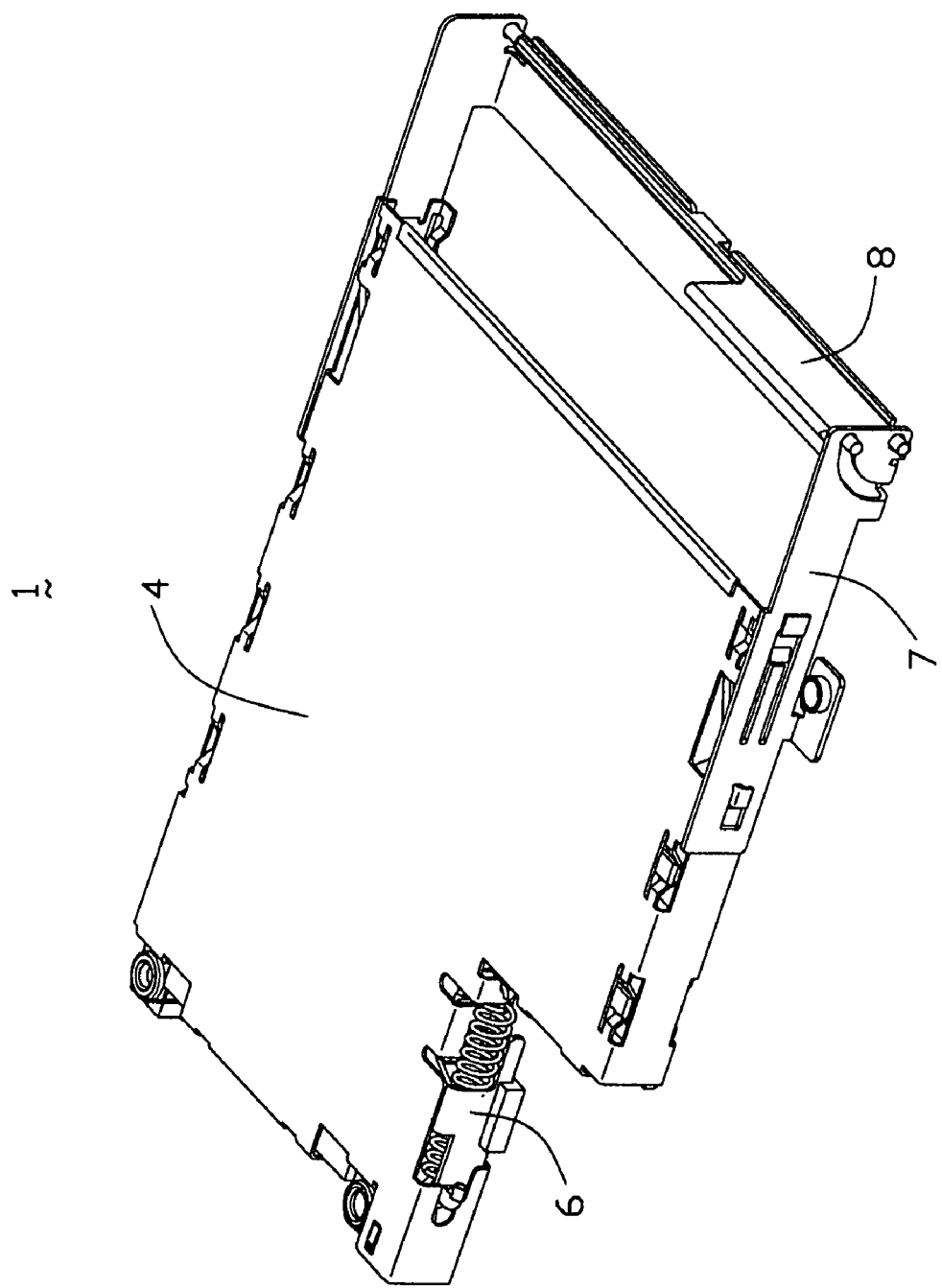
FIG. 1 is a perspective, assembled view of a memory card connector in accordance with the present invention.

Referring to the drawings in greater detail, and first to FIGS. 3-6, the invention is embodied in a memory card connector with a generally L-shape configuration, generally designated 1, for receiving two memory cards, namely a rectangular memory card, generally designated 10, and a L-shape memory card, generally designated 11. Connector 1 includes an insulative housing 2, which is mounted to a printed circuit board (not shown). A plurality of contacts 3 are inserted into the housing 2. A metal cover 4 is mounted to a side of the housing 2. A metal bracket 7 is installed to the metal cover 4, and defines a pair of through holes 700 thereon, through which a foldable baffler 8 can fasten and pivot relative to the metal bracket 7. This connector 1 also includes a guide rail 5, received in connector 1, for guiding insertions of two memory cards 10, 11 together with the housing 2, and a card-ejecting mechanism 6 installed at the metal cover 4, for ejecting two memory cards 10, 11 from the connector 1.

Figure 3:
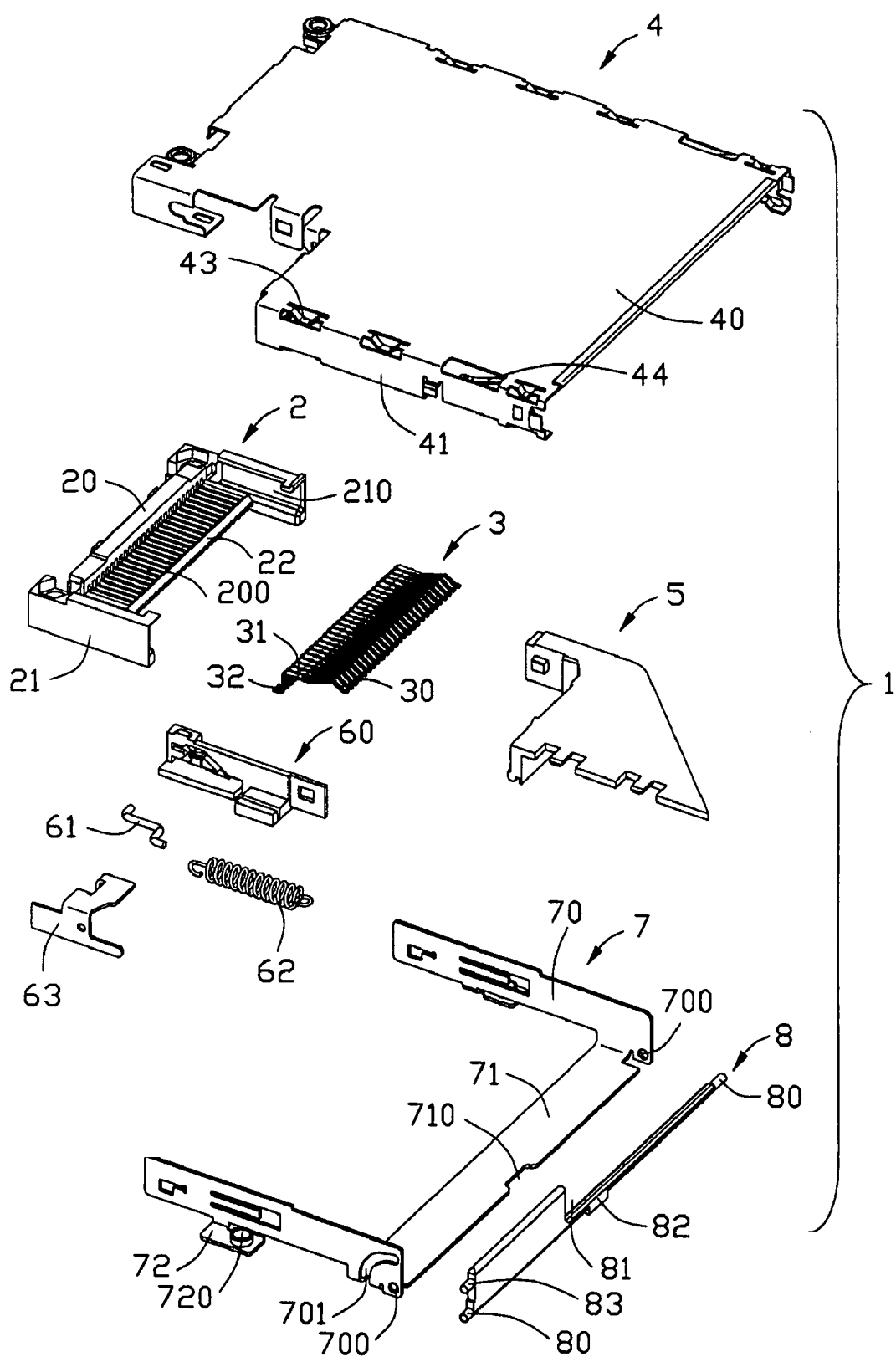
FIG. 3 is an exploded view of the memory card connector in according with the present invention.
Figure 4:
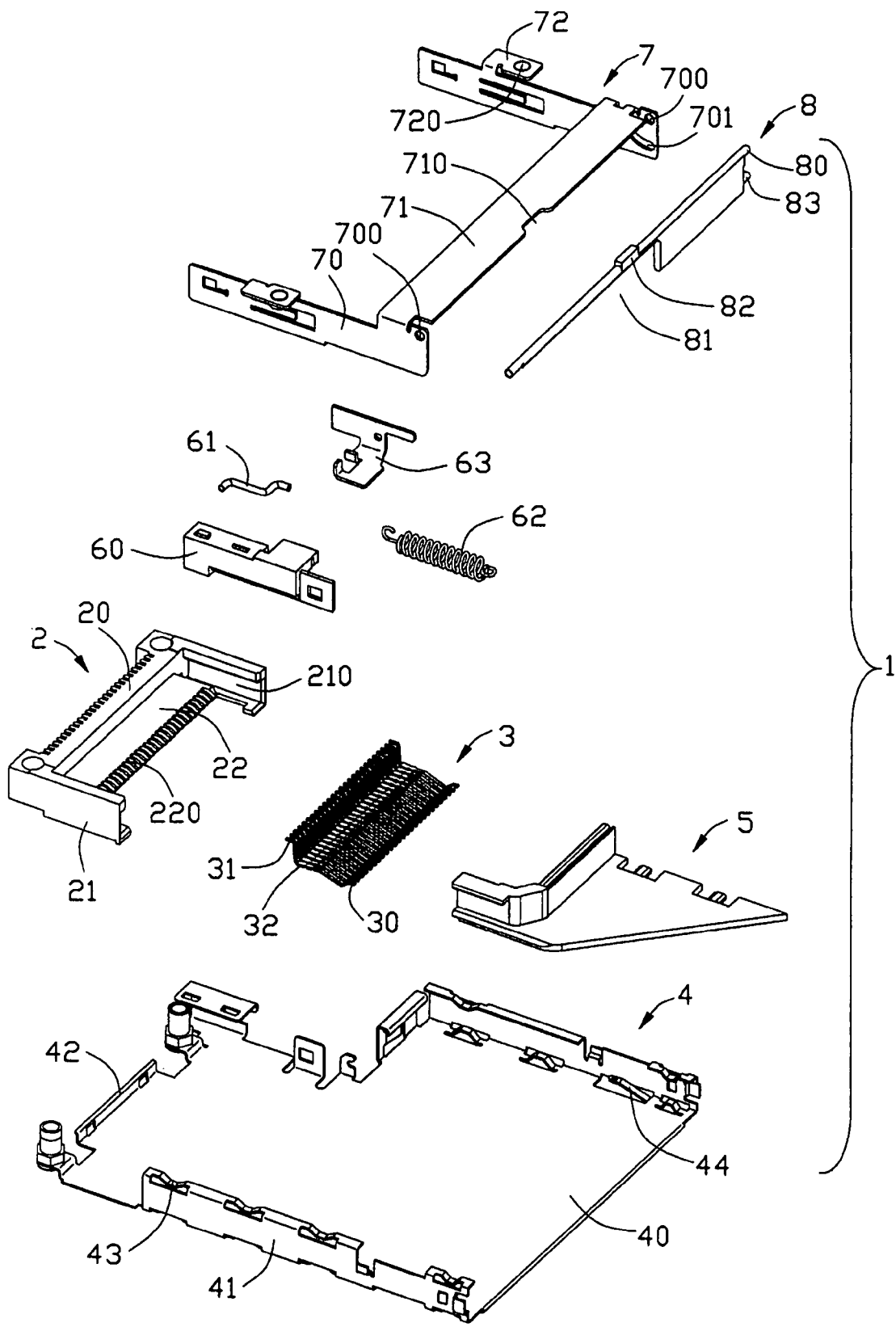
FIG. 4 is a view similar to FIG. 3, but taken from different aspect.

More particularly, with reference to FIGS. 3-4, insulative housing 2 defines a card insertion direction. Along this direction, two memory cards 10, 11 are inserted into or pulled from connector 1. Housing 2 includes a traverse base section 20, a pair of arm section 21 rearwardly extending from two lateral sides of the base section 20, and a tongue section 22 located between two arm section 21 and extending from base section 20. A pair of guiding slots 210 is respectively defined in inner walls of arm section 21 for guiding insertions of memory cards 10, 11. A plurality of contact passageways 200 extends through base section 20 and tongue section 22 for receiving said contacts 3. The housing 2 is located at a front end of the metal cover 4.

Each contact 3 includes a mating end 30 received in tongue section 22 for electrically connection to memory cards 10, 11, a connecting portion 32 interferentially retained in contact passageways 200, a tail end 31 bent upwardly at a right-angle to connecting portion 32 for electrically connecting, as by soldering, to said printed circuit board.

The metal cover 4 is generally of a L-shape configuration, and covers on housing 2. This cover 4 includes a lower wall 40, a pair of lateral walls 41 bent upwardly from lateral edges of the lower wall 40, and a front wall 42 bent upwardly from a front edge of the lower wall 40, these walls together define a receiving space (not labeled) and an insert opening (not labeled) generally at a rear end of the metal cover 4. Two memory cards 10, 11 are inserted into the receiving space in said insertion direction through insert opening. Lower wall 40 with a L-shape configuration, defines a plurality of protrusion 43 formed at lateral edges thereof, and projecting toward the receiving space, and two spring 44 respectively arrayed in a line with lateral protrusions 43. Similarly, lateral walls 41 bent inwardly to form a pair of short pieces (not labeled), and a plurality of protrusion 43 and springs 44 formed at two short pieces and arrayed in a line. These protrusion 43 and springs 44 together define a pair of guiding slots (not labeled) for guide insertions of memory cards 10, 11. Referring to FIGS. 3-4, a left lateral wall 41 is longer than the other right lateral wall 41. A pair of screws (not labeled), located at lateral sides of front wall 42, extends through metal cover 4, and housing 2 to mate with a device, such as nuts (not shown) installed on the printed circuit board for fixing connector 1 in position.

Figure 6:
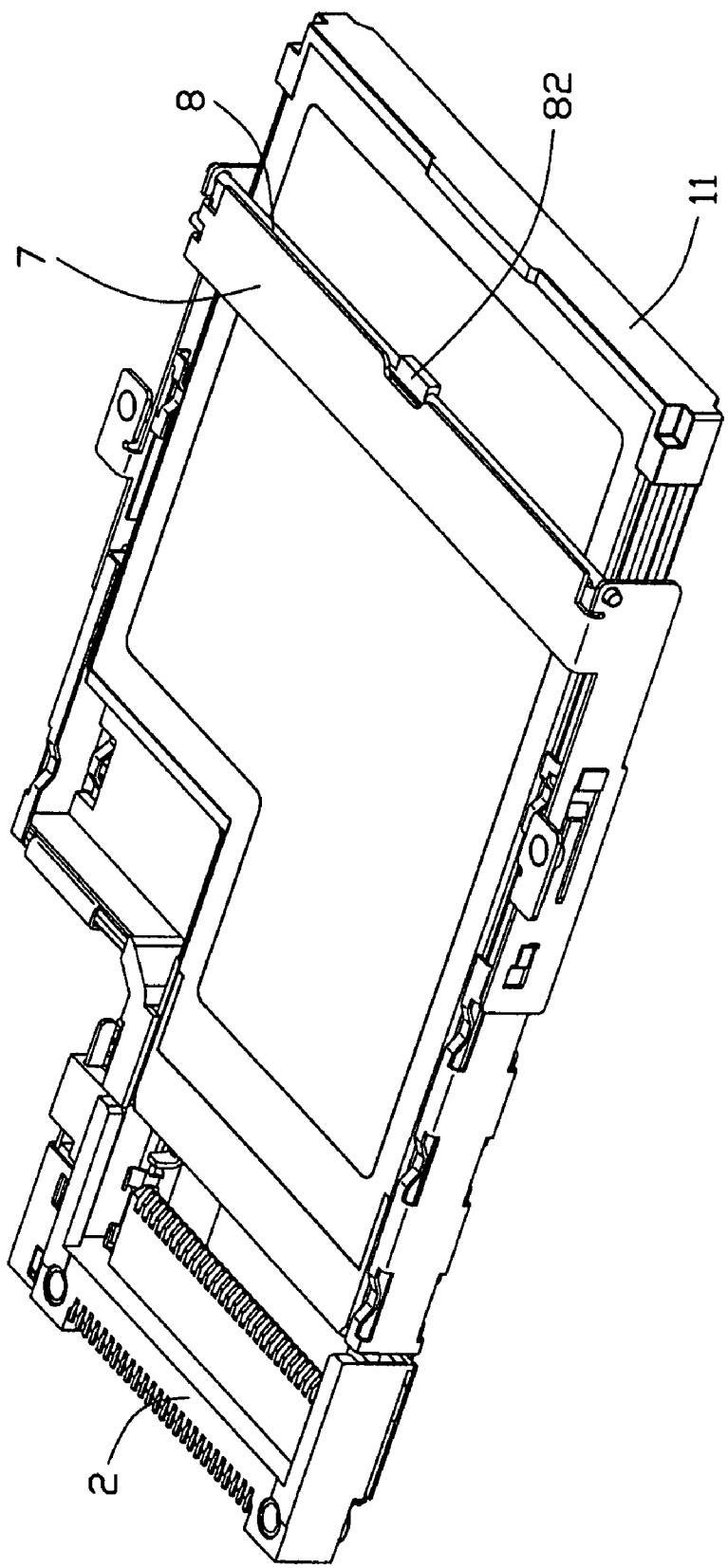

Referring to FIG. 6, card-ejecting mechanism 6 is installed at a side of metal cover 4, and includes a base section 60, a guide pole 61 circularly moving in circular slot formed at base section 60, a spring 62 locking with guide pole 61, and a metal piece 63 located at outer side of the guide pole 61 for avoiding deviation of guide pole 61 from circular slot. Detailed description on work process and assembly of card-ejecting mechanism 6 omits thereafter, for it is obvious to an ordinary skilled person in this art.

Referring to FIG. 4, metal bracket 7, installed at the insert opening of metal cover 4, includes a traverse piece 71, and a pair of lateral arm pieces 70 bent downwardly at a right angle to traverse piece 71 and extending forwardly therefrom. A pair of mounting ear 72 projecting outwardly from top edges of arm pieces 70, with a through hole 720 therein for allowing screws to extend through and fix the metal bracket 7 to said printed circuit board. And, each lateral arm pieces 70 has several locking apertures (now labeled) for engaging with corresponding locking pieces (now labeled), and resultantly causing a reliable connection between metal cover 4 and metal bracket 7.

Each arm piece 70 includes a pivot hole 700, these two pivot holes 700 are opposite to each other, and in a liner array being parallel to traverse piece 71. In addition, one arm piece 70, located at a similar side as said short lateral wall 41, further has an arc slot 701 with a central angle of ninety degrees generally. The traverse piece 71 has an aperture 710 defined generally at middle thereof along a traverse direction. Noticeably, said liner array defined by linking two pivot holes 700 is regarded as "traverse axis", by which the foldable baffler 8 pivots in a boundary of central angle defined by arc slot 701.

Figure 2:
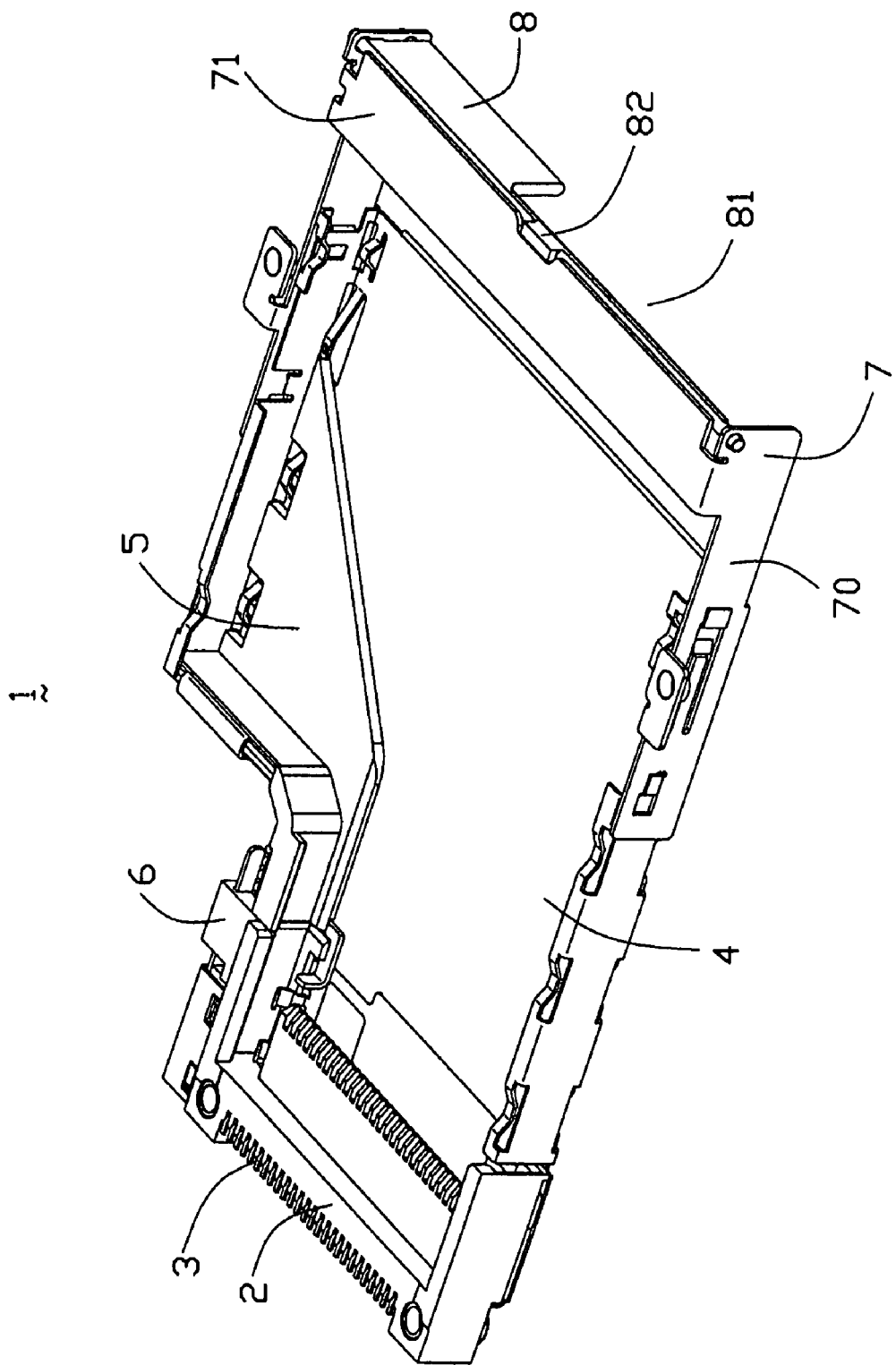
FIG. 2 is a view similar to FIG. 1, but taken from different aspect.

The foldable baffler 8 is installed to the metal bracket 7, and located adjacent to an insertion opening (not labeled) defined by the metal bracket 7 and metal cover 4. The foldable baffler 8 with a traverse dimension that is generally equal to interval between two pivot holes 700. Two pivot pins 80 formed at two tips of the baffler 8, is received in pivot holes 700, as seen in FIG. 2, for fixing the baffler 8 at the metal bracket 7. A third pivot pin 83 is received in arc slot 701 for allowing a pivot of the baffler 8. For reason of close arc slot 701, the foldable baffler 8 can only turn inwardly to close the traverse piece 71, and cannot turn outwardly. This baffler 8 also has an opening 81 opposite to housing 2 along said card insertion direction for allowing the rectangular memory card 10 to extend through, and a protrusion 82 formed at middle in traverse direction thereof and restrictively engaged with aperture 710, for avoiding slide of the baffler 8 along said traverse direction thereof.

Figure 5:
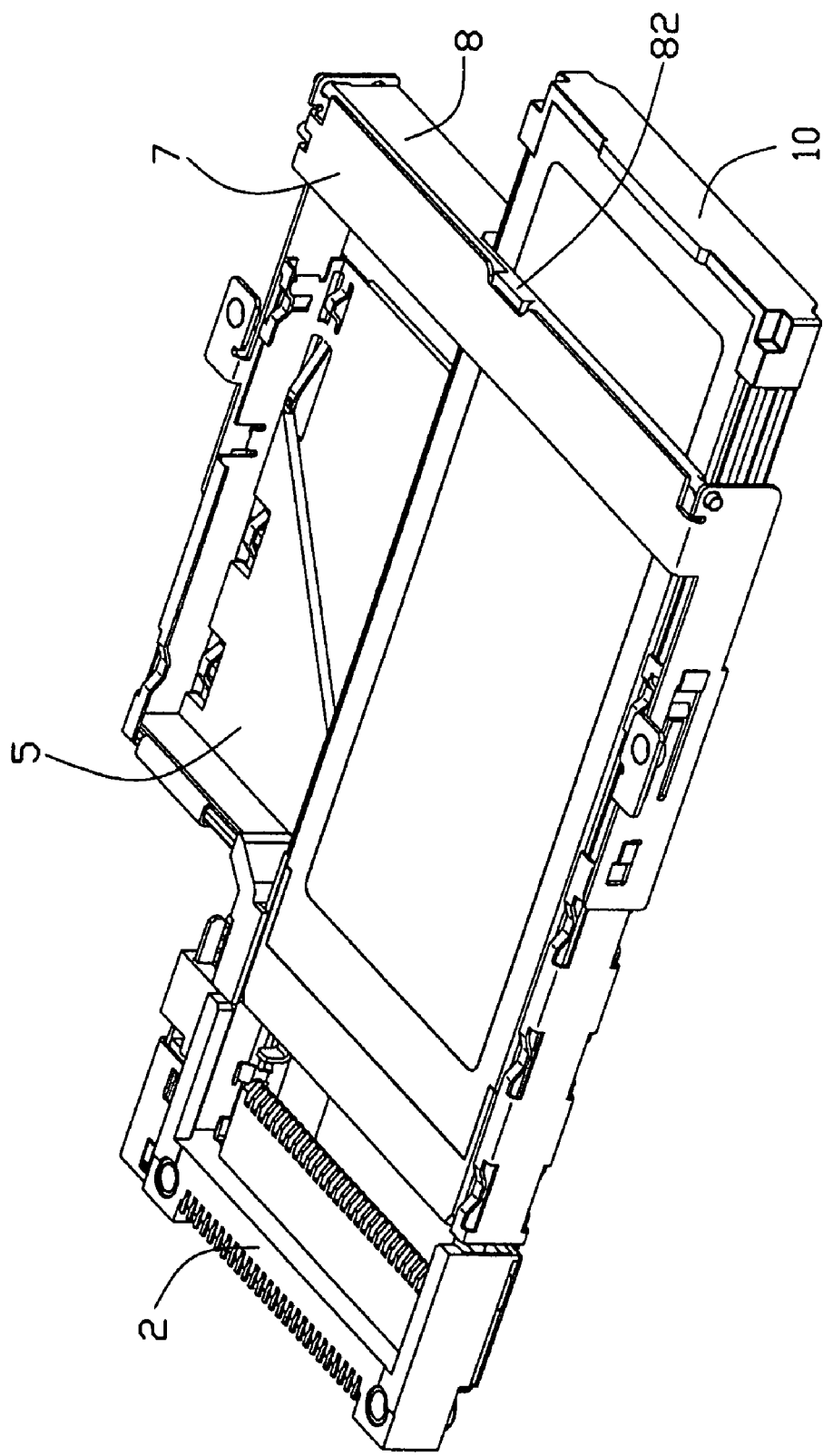

Referring to FIG. 2 and in conjunction with FIGS. 5-6, the connector 1 is installed to a device, such as the printed circuit board, and located below the printed circuit board. By this installation, the foldable baffler 8 cover the insertion opening, as seen in FIG. 2, of the connector 1 for its weight. Referring to FIG. 5, when the rectangular memory card 10 is inserted into or pulled from the receiving space of connector 1 through the opening 81 of the foldable baffler 8, the rectangular memory card 10 cannot deviate from its normal trace for two lateral sides thereof being restrictively abutted by the foldable baffler 8 and the metal bracket 7. Referring to FIG. 6, when the L-shape memory card 11 is inserted into the receiving space of connector 1, the foldable baffler 8 will be pushed by memory card 11 and pivot inwardly to close the traverse piece 71 along said traverse axis. And, when L-shape memory card 11 is pulled out, the foldable baffler 8 will move back to initial position by its own weight. Referring to FIG. 2, the traverse piece 71 is higher than the arm piece 70, and defines interval between a lower surface of the traverse piece 71 and a top edge of the arm piece 70 with a height being generally equal to thickness of foldable baffler 8. So, memory cards 11 won't be barred by foldable baffler 8 since the baffler 8 can be pushed and locate in said interval.

In addition, in another preferred embodiment, the metal bracket 7 and metal cover 4 are unitarily stamped by one piece metal strip, and do not need to assemble them as illustrated in above preferred embodiment. And, the foldable baffler 8 also can be installed to lower wall 4, and differently, the connector 1 should be installed "on" a printed circuit board, for allowing the foldable baffler 8 to cover the insertion opening in its initial state.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A memory card connector for respectively receiving two memory cards, a rectangular memory card and a L-shaped memory card, comprising:
   a metal cover defining a generally L-shaped receiving space receiving two memory cards inserted into the receiving space in an insertion direction through an insert opening generally at a rear end of the cover;
   an insulative housing at a front end of the metal cover opposite to said inset opening;
   a plurality of contacts mounted in the insulative housing and connection to the memory cards;
   a metal bracket installed to the rear end of the metal cover; and
   a foldable baffler mounted to the metal bracket, with an opening opposite to insulative housing in said insertion direction, when the rectangular memory card is inserted into or pulled from the receiving space through the opening of the foldable baffler, the rectangular memory card is held for preventing deflection;
   wherein the foldable baffler pivots toward the receiving space along a traverse axis defined by the metal bracket when said L-shaped memory card is inserted into the receiving space, and moves back to initial position by its own weight when said L-shaped memory card is pulled out from the connector.

2. The memory card connector as described in claim 1, wherein the metal bracket has a traverse piece, and a pair of arm pieces forwardly extending from the traverse piece and engaged with metal cover, said foldable baffler is rotatablely mounted to said arm pieces with tips thereof being inserted into pivot holes defined in arm pieces.

3. The memory card connector as described in claim 2, wherein the traverse piece defines an aperture at an outer side thereof for engaging with a protrusion formed at the foldable baffler.

4. The memory card connector as described in claim 2, wherein one of arm piece defines a close arc slot with a central angle generally of ninety degrees, the foldable baffler has a pivot pin moveably received in the close arc slot for providing a movement boundary of the foldable baffler.

5. The memory card connector as described in claim 2, wherein each of said arm pieces includes a mounting ear outwardly projecting for installing the connector to a support component.

6. The memory card connector as described in claim 2, wherein each of said arm piece includes a locking aperture engaged with locking piece formed at a lateral wall of the metal cover.

7. The memory card connector as described in claim 1, wherein the connector defines a mating plane higher than metal cover for mating the connector below a printed circuit board.

8. A memory card connector for receiving two different types memory cards, comprising:
   a metal cover defining a receiving space in which two different types of memory cards are insertable in an insertion direction through an insert opening generally at a rear end of the metal cover to respectively correspondingly connect with contacts mounted in a connector housing at a front end of metal cover; wherein
   said metal cover further includes a pair of lateral walls spaced from each other in a direction transversely of said insertion direction, and a foldable baffler is mounted to the lateral walls at said insert opening and includes an opening opposite to said connector housing in said insertion direction, when a memory card is inserted into the receiving space through the opening of the foldable baffler, this memory card is restrictively held by foldable baffler for avoiding deflection thereof;
   wherein said baffler pivots toward the receiving space along a traverse axis when the other type memory card is inserted into the receiving space, and moves back to initial position by its own weight when the other type memory card is pulled out from the connector.

9. The memory card connector as described in claim 8, wherein the front end of said metal cover is narrower than the rear end thereof whereby said receiving space is generally L-shaped in a horizontal plane.

10. The memory card connector as described in claim 8, wherein said metal cover further comprises a metal bracket with a U-shaped formed as a part thereof, said foldable baffler is mounted to two spaced lateral pieces of the metal bracket.

11. The memory card connector as described in claim 8, wherein each of said lateral walls includes a pivot hole at a rear end thereof for receiving tips of said foldable baffler.

12. The memory card connector as described in claim 11, wherein one of said lateral walls includes a close arc slot, the foldable baffler has a pivot pin received in and moving along said close arc slot, for limiting pivotable range thereof.

13. The memory card connector as described in claim 8, wherein the connector defines a mating plane with two type memory cards being located above said mating plane whereby the connector is installed on a support component.

14. The memory card connector as described in claim 8, wherein the connector defines a mating plane with two type memory cards being located below said mating plane whereby the connector is installed below a support component.

15. The memory card connector as described in claim 8, wherein one of said two different types memory cards is of a rectangular configuration, and the other is of a L-shaped.

16. An electrical card connector comprising:
   a metal cover defining a receiving space for mutually exclusively receiving larger and smaller memory cards inserted into the receiving space in an insertion direction through an insert opening generally at a rear end of the cover;
   an insulative housing at a front end of the metal cover opposite to said inset opening;
   a plurality of contacts mounted in the insulative housing for connection to the memory cards;
   a metal bracket installed to the rear end of the metal cover; and
   a baffler mounted to the metal bracket and moveable relative to the housing, said baffler defining an opening in said insertion direction so that the smaller memory card is restrainedly guided during insertion or withdrawal of the smaller memory card through the opening of the baffler when the baffler is located in a first position, and the larger memory card pushed the baffler to a second position during insertion or withdrawal of the larger memory card through the insert opening.

17. The electrical card connector as claimed in claim 16, wherein the baffler defines at least two edges restrainedly confront the smaller memory card, respectively, when said baffler is located in the first position.

* * * * *